United States Patent [19]

Tsunoda

[11] Patent Number: 5,488,256
[45] Date of Patent: Jan. 30, 1996

[54] SEMICONDUCTOR DEVICE WITH INTERCONNECT SUBSTRATES

[75] Inventor: Tetsujiro Tsunoda, Fujisawa, Japan

[73] Assignee: Kabushiki Kaisha Toshiba, Kawasaki, Japan

[21] Appl. No.: 299,964

[22] Filed: Sep. 2, 1994

[30] Foreign Application Priority Data

Sep. 3, 1993 [JP] Japan .................. 5-219580

[51] Int. Cl.$^6$ .................. H01L 23/48; H01L 29/44; H01L 29/52; H01L 29/60
[52] U.S. Cl. .................. 257/723; 257/691; 257/724
[58] Field of Search .................. 257/500, 723, 257/724, 725, 691, 728

[56] References Cited

U.S. PATENT DOCUMENTS

| | | | |
|---|---|---|---|
| 5,291,005 | 3/1994 | Arai et al. | 257/691 |
| 5,313,095 | 5/1994 | Tagawa et al. | 257/724 |
| 5,317,194 | 5/1994 | Sako | 257/723 |

Primary Examiner—William Mintel
Assistant Examiner—Roy Potter
Attorney, Agent, or Firm—Oblon, Spivak, McClelland, Maier & Neustadt

[57] ABSTRACT

A hybrid IC has a metal base 1, a control element interconnect substrate 2 having a thin wiring pattern, and a power element interconnect substrate 3 having a thick wiring pattern. The interconnect substrates 2 and 3 are mounted on the metal base 1. Extensions 13 protrude from the wiring pattern on the interconnect substrate 3, to electrically connect the interconnect substrate 3 to the interconnect substrate 2. This structure never complicates manufacturing processes and enables the interconnect substrates 2 and 3 to be separately tested before final assembling work, thereby improving productivity.

5 Claims, 12 Drawing Sheets

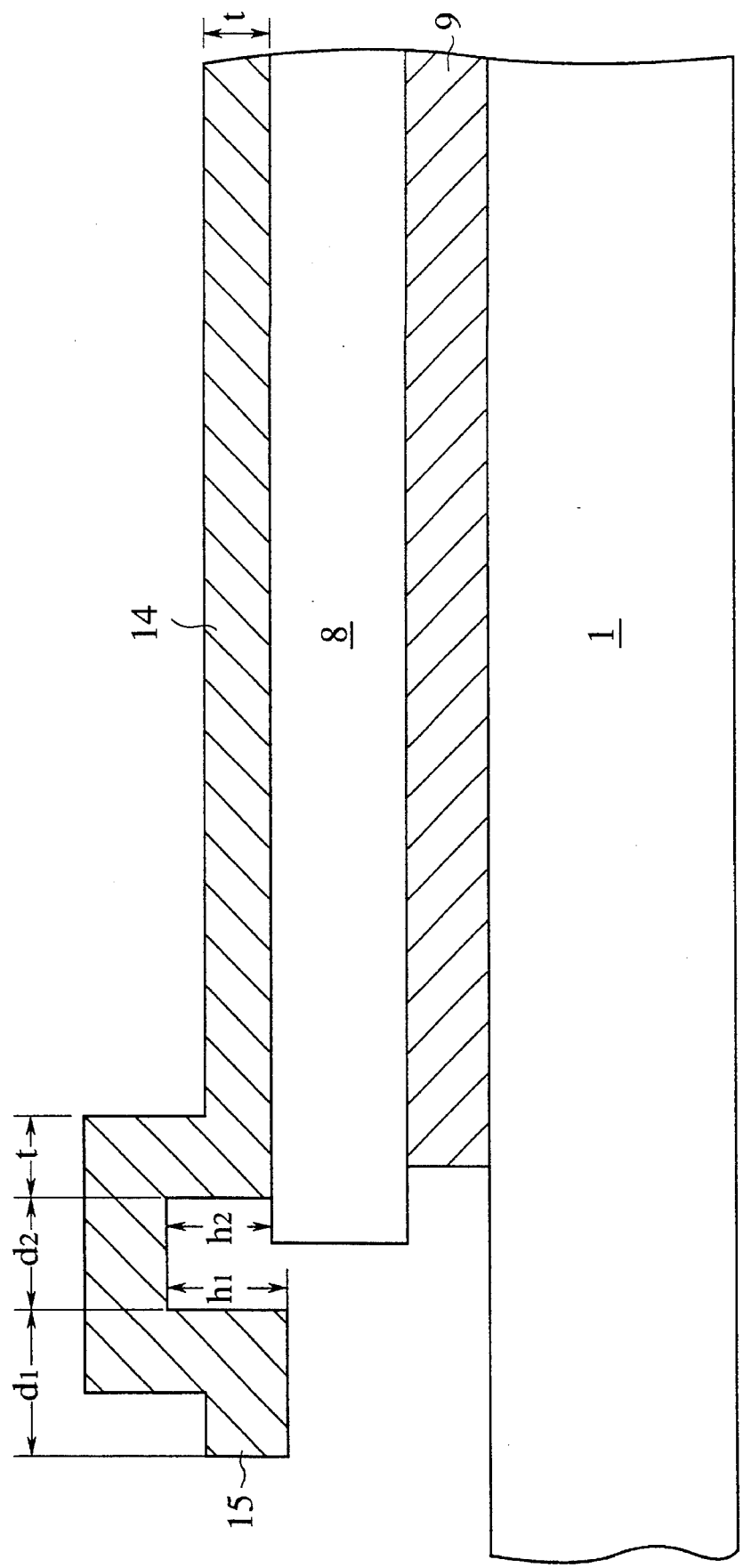

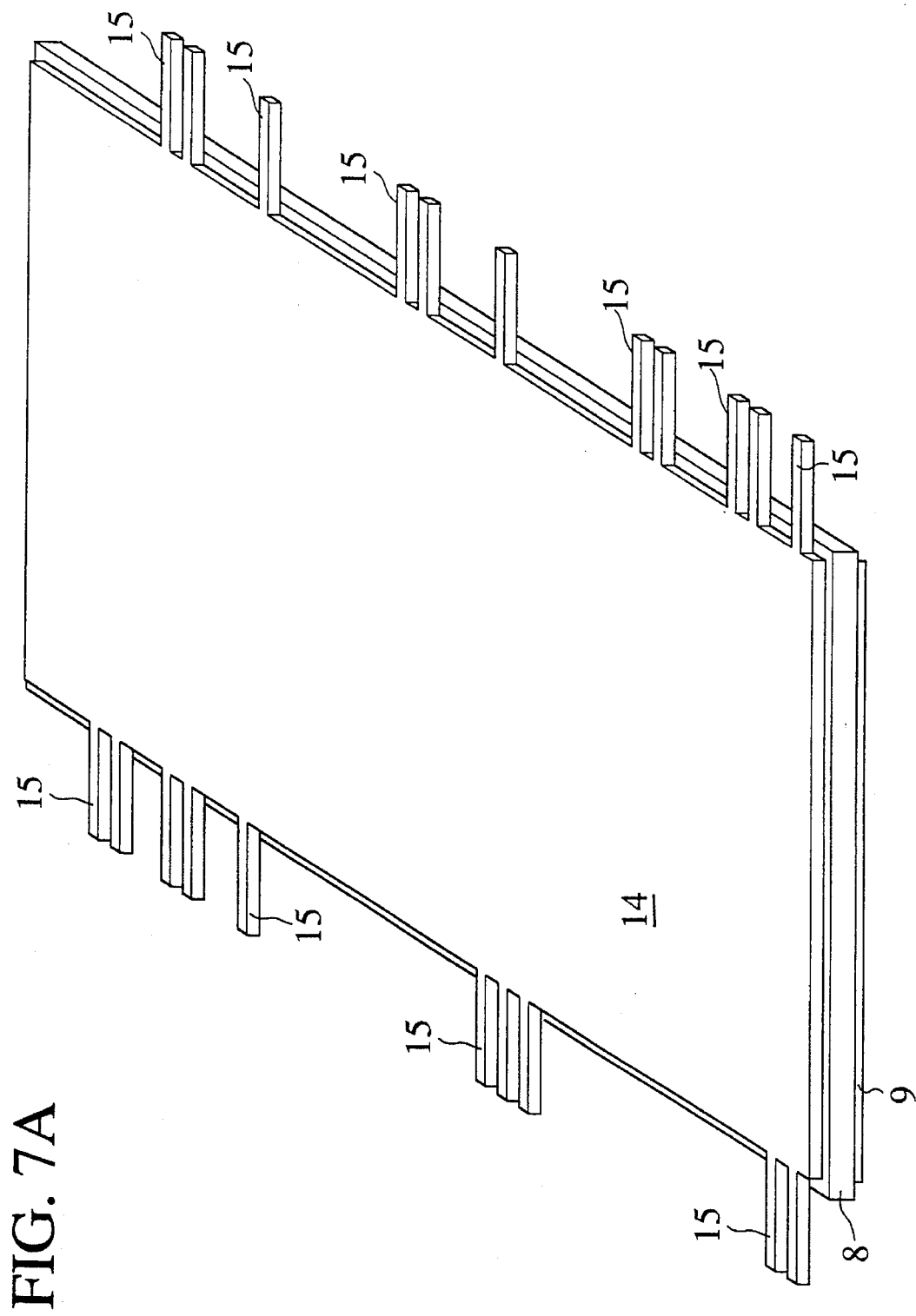

5,488,256

SEMICONDUCTOR DEVICE WITH INTERCONNECT SUBSTRATES

BACKGROUND OF THE INVENTION

1. Field of the Invention

The present invention relates to a semiconductor device employing a high-density interconnect substrate for packaging power semiconductor elements such as IGBTs (Insulated Gate Bipolar Transistors) and control elements for controlling the power semiconductor elements. In particular, the present invention relates to a compact, light, high-performance semiconductor device such as a hybrid IC employing ICs as control elements.

2. Description of the Prior Art

FIG. 12A is a plan view showing a semiconductor device according to a prior art employing power semiconductor elements as well as control elements for controlling the power elements. FIG. 12B is a sectional view of the device of FIG. 12A. A metal base 101 is made of, for example, Cu. A interconnect substrate 105 is soldered onto the metal base 101. The interconnect substrate 105 is composed of a ceramic substrate 102 made of, for example, alumina, a metal layer 103 made of, for example, Cu formed on the bottom surface of the substrate 102, and a wiring pattern 104 made of, for example, Cu formed on the top surface of the substrate 102. The metal layer 103 is entirely formed on the bottom surface of the substrate 102 except the periphery thereof and is soldered to the metal base 101.

On the wiring pattern 104, power semiconductor elements 106 and control elements 107 are surface mounted. The ceramic substrate 102 electrically insulates the wiring pattern 104 from the metal base 101. The thinner the substrate 102, the better the heat dissipation performance of the power semiconductor elements 106. In consideration of mechanical strength, the substrate 102 is usually 0.6 to 0.8 millimeters thick. The wiring pattern 104 passes a large current so that the thickness thereof is about 0.3 to 0.5 millimeters. The metal layer 103 functions to reduce stress caused in the interconnect substrate 105 due to temperature changes. Accordingly, the metal layer 103 has a thickness of 0.3 to 0.5 millimeters, which is substantially equal to that of the wiring pattern 104. Minimum wiring width and intervals are dependent on the thickness of a conductor of the wiring pattern 104. The wiring pattern 104 is usually formed by isotropic wet etching. When the conductor is etched in a thickness direction, it is also etched sideward. This is unavoidable. Accordingly, when the thickness of the conductor of the wiring pattern 104 is 0.3 millimeters, the minimum wiring width and intervals must be about 0.5 millimeters. Since the number of wirings for surface mounted control elements is high, the area of the interconnect substrate 105 must be expanded.

To reduce the substrate area, a multilayer wiring structure will be effective. This structure, however, is actually impossible when the thickness of the conductor of the wiring pattern 104 is about 0.3 millimeters because a large level difference will be formed between part having a multilayer wiring pattern and part having no wiring pattern. A shield pattern to prevent malfunctions of the control elements is sometimes laid under the control elements. There is no space, however, to arrange the shield pattern under the control elements when the thickness of the conductor of the wiring pattern 104 is about 0.3 millimeters. In addition, the thickness of 0.3 millimeters of the wiring pattern makes it hard to fix the surface mounted elements onto the wiring pattern. It is also hard to apply solder resist to the wiring pattern. These problems will be solved if the wiring pattern is thin. This, however, increases wiring resistance to hardly pass a large current and produces heat to deteriorate the characteristics of the power elements. Accordingly, the wiring pattern is usually not thinned.

To solve these problems of the prior art, the devices of FIGS. 10 and 11 may be proposed to employ separate interconnect substrates for power semiconductor elements and control elements. A metal base 111 is made of, for example, Cu. A power element interconnect substrate 115 and a control element interconnect substrate 119 are soldered onto the metal base 111. The power element interconnect substrate 115 is composed of a ceramic substrate 112, a metal layer 113 formed on the bottom surface of the substrate 112, and a wiring pattern 114 made of, for example, Cu formed on the top surface of the substrate 112. The control element interconnect substrate 119 is composed of a glass epoxy substrate 116, a metal layer 117 made of, for example, Cu formed on the bottom surface of the substrate 116, and a wiring pattern 118 made of, for example, Cu formed on the top surface of the substrate 116. The metal layer 113 is entirely formed on the substrate 112 except the periphery thereof and is soldered to the metal base 111. Power semiconductor elements 120 such as IGBTs are mounted on the wiring pattern 114. The metal layer 117 of the interconnect substrate 119 is soldered to the metal base 111. Control elements 121 are mounted on the wiring pattern 118 of the interconnect substrate 119. FIGS. 10 and 11 show two different ways of electrically connecting the power and control element interconnect substrates 115 and 119 to each other. FIG. 10 electrically connects the interconnect substrates 115 and 119 to each other with jumper wires 122, while FIG. 11 electrically connects the power semiconductor elements 120 on the interconnect substrate 115 to the substrate 116 of the interconnect substrate 119 with bonding wires 123.

The wiring patterns 114 and 118 of the power and control element interconnect substrates 115 and 119 may have each a proper thickness; depending on the rated current of its own. Namely, the wiring pattern 118 for the control elements may be thinned to about 0.035 millimeters because it passes a small current. This helps make the wiring pattern 118 finer, to thereby reduce the area of the interconnect substrate 119.

The advantages and disadvantages of the devices of FIGS. 10 and 11 will be considered. The device of FIG. 10 finishes the interconnect substrates 115 and 119 at first and connects them to each other with the jumper wires 122. Accordingly, the finished substrates 115 and 119 can be tested before connecting them together with the jumper wires 122. This art of FIG. 10 is advantageous in finding defects and minimizing parts losses due to the defects but is disadvantageous in needing the additional process of electrically connecting the interconnect substrates 115 and 119 with the jumper wires 122 after mounting elements on the interconnect substrates. Consequently, this art of FIG. 10 complicates manufacturing processes and deteriorates productivity.

The device of FIG. 11 needs no additional jumper wires, and therefore, never increases the number of manufacturing processes. However, surface electrodes of the power semiconductor elements 120 on the interconnect substrate 115 are electrically disconnected until the power element interconnect substrate 115 is electrically connected to the control element interconnect substrate 119, so that it is impossible to separately test the power element interconnect substrate 115 in advance. Only after the interconnect substrates 115 and 119 are electrically connected to each other, defects will be found. Accordingly, the device of FIG. 11 will involve a larger number of parts losses than the device of FIG. 12.

SUMMARY OF THE INVENTION

A first object of the present invention is to solve the problems of the prior art of FIG. 12 and the related devices of FIGS. 10 and 11 and provide a semiconductor device employing a power element interconnect substrate passing a sufficiently large current and a control element interconnect substrate having a reduced wiring area.

A second object of the present invention is to provide a semiconductor device fulfilling the first object, having a power element interconnect substrate and a control element interconnect substrate to be easily fabricated and independently tested to early find defects.

A third object of the present invention is to provide a semiconductor device having a control element interconnect substrate of fine structure to reduce stray impedance and realize high-frequency low-noise operation.

A fourth object of the present invention is to provide a semiconductor device employing a power element interconnect substrate of low wiring resistance and low heat generation and minimize the heat influence of the power element package on a control element interconnect substrate, to realize stable operation.

In order to accomplish the objects, the present invention provides a semiconductor device of FIGS. 1A and 1B. This device employs a first interconnect substrate 3 for packaging power semiconductor elements such as IGBTs, a second interconnect substrate 2 for packaging control elements for controlling the power semiconductor elements, and a metal base 1 for supporting the first and second interconnect substrates 3 and 2. A wiring pattern of one of the first and second interconnect substrates 3 and 2 has extensions 13 protruding from the substrate, for electrically connecting the first and second interconnect substrates 3 and 2 to each other.

The first interconnect substrate 3 serving as a power element interconnect substrate and the second interconnect substrate 2 serving as a control element interconnect substrate are separately fabricated with different wiring patterns having different conductor thicknesses, so that the interconnect substrate 3 may allow a large current while the interconnect substrate 2 may have a fine wiring pattern. Before the interconnect substrates 2 and 3 are electrically connected to each other with the extensions 13, they can be tested independently of each other. No additional processes are needed to connect the interconnect substrates to each other.

Other and further objects and features of this invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION THE DRAWINGS

FIGS. 5 and 6 are sectional views showing a semiconductor device according to a third embodiment of the present invention;

FIGS. 7A and 7B are perspective views showing processes of manufacturing the semiconductor device of the third embodiment;

DETAILED DESCRIPTION OF THE EMBODIMENTS

Figure 1A:
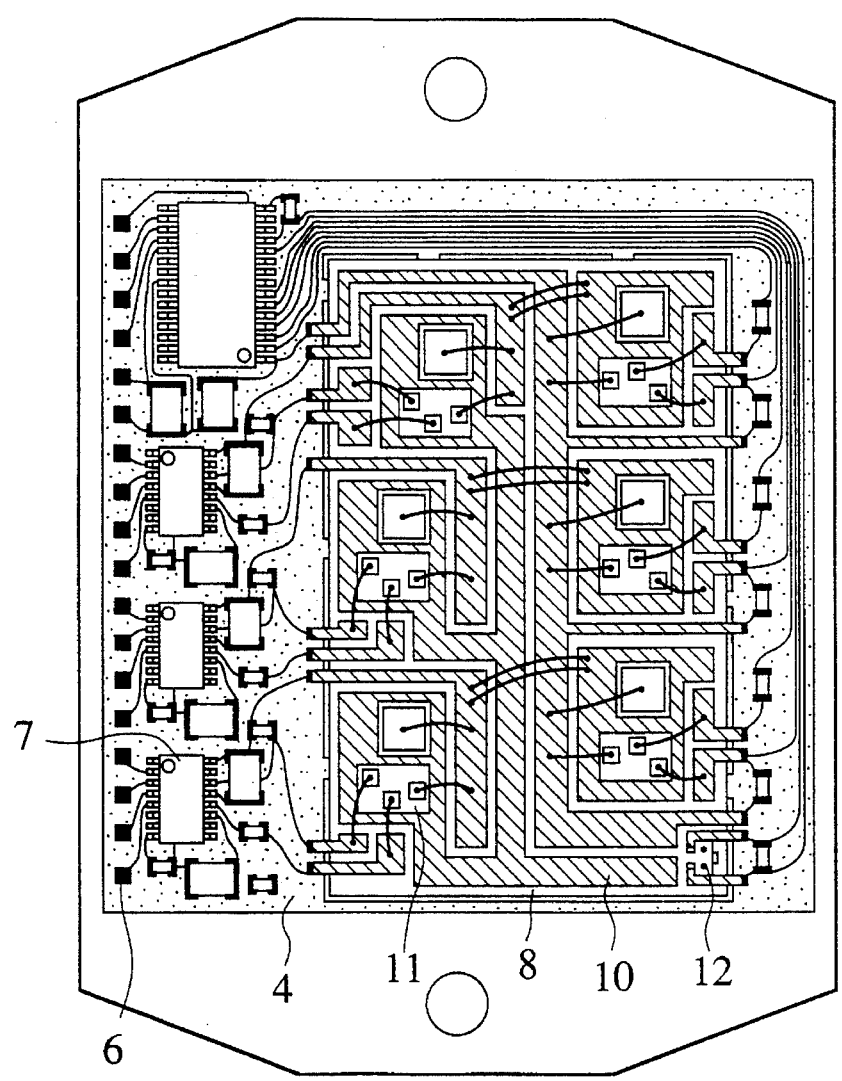
FIGS. 1A and 1B are plan and sectional views showing a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 1B:
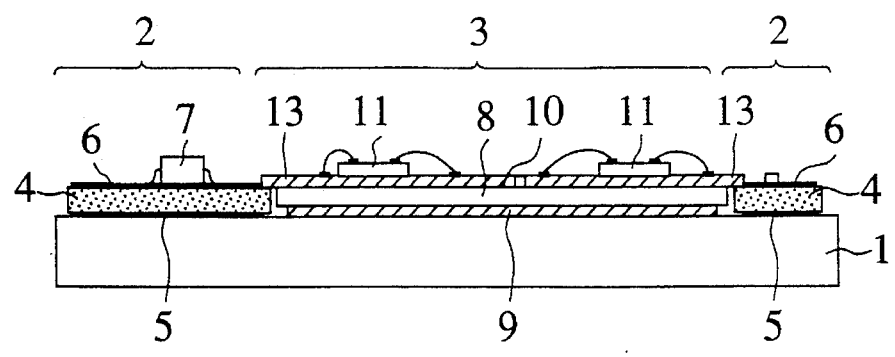
Figure 2A:
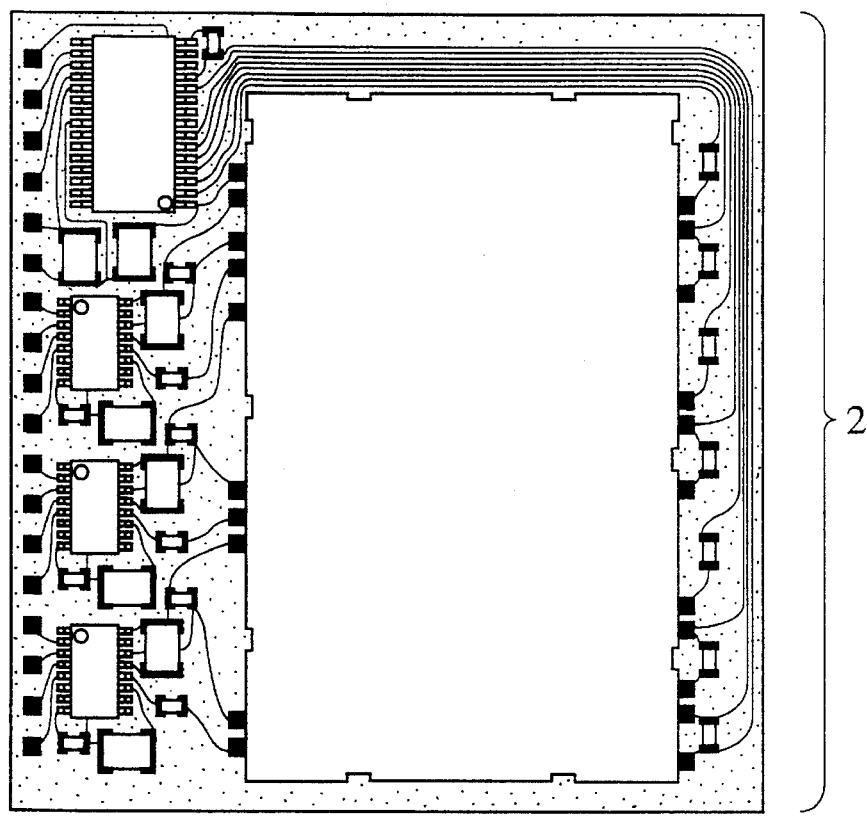
FIGS. 2A and 2B are exploded views showing the semiconductor device of the first embodiment.
Figure 2B:
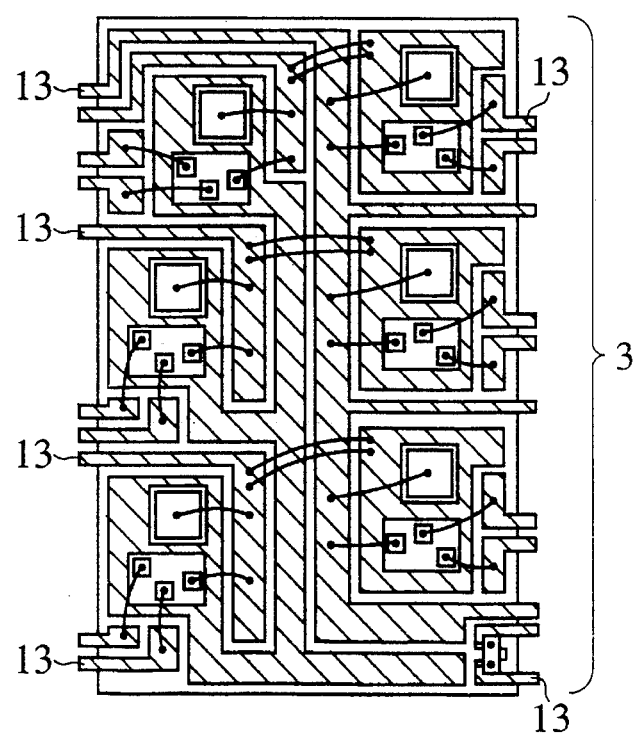
Figure 3:
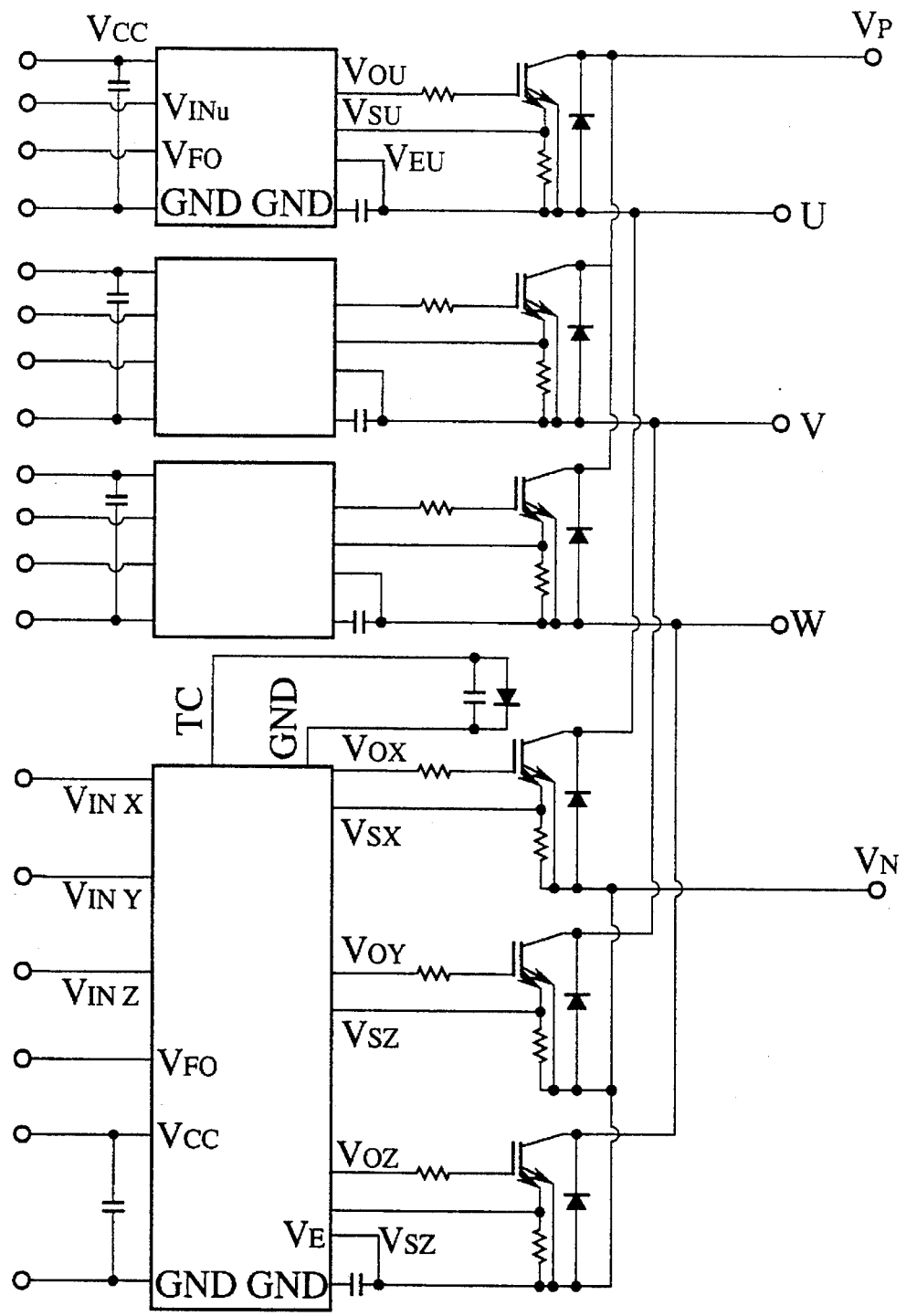
FIG. 3 is circuit diagram showing an inverter circuit based on the first embodiment.

FIGS. 1 to 3 show a semiconductor device according to the first embodiment of the present invention.

This device is an inverter circuit formed on a metal base 1. The inverter circuit includes a power element interconnect substrate 3 having power semiconductor elements such as IGBTs and a control element interconnect substrate 2 having control circuits such as drive circuits and overcurrent protective circuits for the power semiconductor elements. The metal base 1 is made from, for example, Cu and has a thickness of about 3 millimeters. The metal base 1 supports the power element interconnect substrate 2 of FIG. 2A and the control element interconnect substrate 3 of FIG. 2B. The interconnect substrate 2 is composed of an insulation substrate 4 made of resin such as glass epoxy resin of 0.9 millimeters thick. A metal layer 5 made of, for example, Cu of 0.035 millimeters thick is attached to the bottom surface of the substrate 4. A wiring pattern 6 is formed on the top surface of the substrate 4. On the wiring pattern 6, control elements such as control ICs 7, resistors, and capacitors are mounted. The interconnect substrate 3 is composed of an insulation substrate 8 made of ceramics such as alumina of 0.635 millimeters thick. A metal layer 9 made of, for example, Cu of about 0.3 millimeters thick is formed on the bottom surface of the substrate 8. A wiring pattern 10 made of, for example, Cu is formed on the top surface of the substrate 8. The metal layer 9 is soldered onto the metal base 1. The wiring pattern 10 and metal layer 9 may be bonded to the ceramic substrate 8 directly or through metal such as Ni. On the wiring pattern 10, there are mounted power semiconductor elements 11 and temperature detection elements 12 if required. Part of the wiring pattern 10 forms extensions 13 protruding from the interconnect substrate 3. The extensions 13 electrically connect the interconnect substrates 2 and 3 to each other. The extensions 13 are soldered to the wiring pattern 6 when the metal layer 9 of the interconnect substrate 3 and the metal layer 5 of the interconnect substrate 2 are soldered to the metal base 1.

A conductor of the wiring pattern 6 on the control element interconnect substrate 2 is thin, e.g., 0.035 millimeters so that the wiring pattern 6 may be very fine. This results in improving package density and reducing the area of the interconnect substrate 2. The wiring pattern 6 can be made very fine by thinning the conductor. This thinning causes no trouble because the interconnect substrate 2 handles only a small current. On the other hand, a conductor of the wiring pattern 10 on the power element interconnect substrate 3 is thick, e.g., 0.3 millimeters to allow a large current. Accordingly, the power semiconductor elements on the interconnect substrate 3 can operate at their maximum rating.

Figure 10:
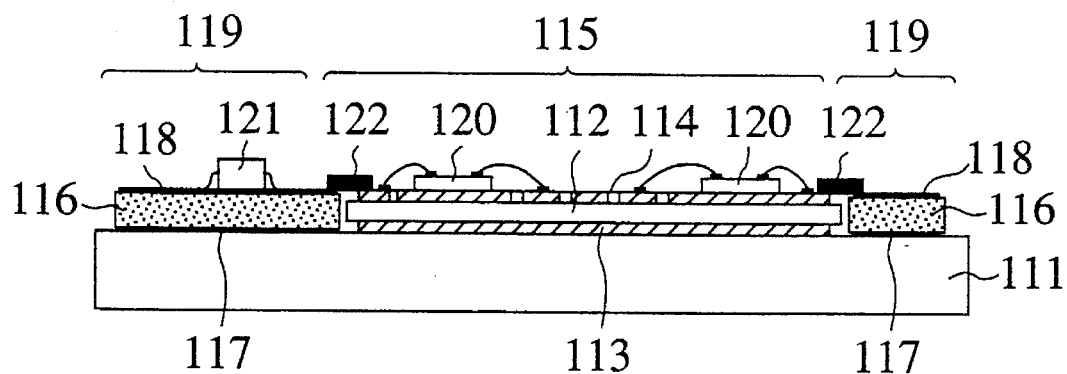
FIGS. 10 and 11 show semiconductor devices according to related arts each having a power element interconnect substrate and a control element interconnect substrate.
Figure 11:
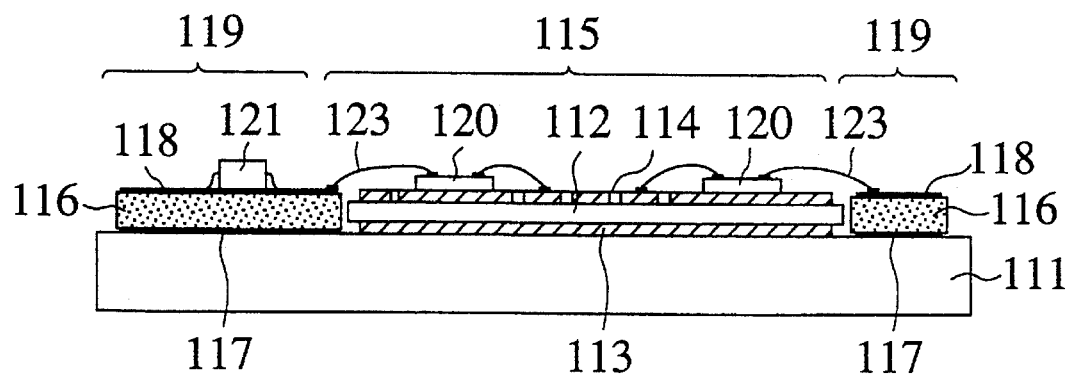
Figure 12A:
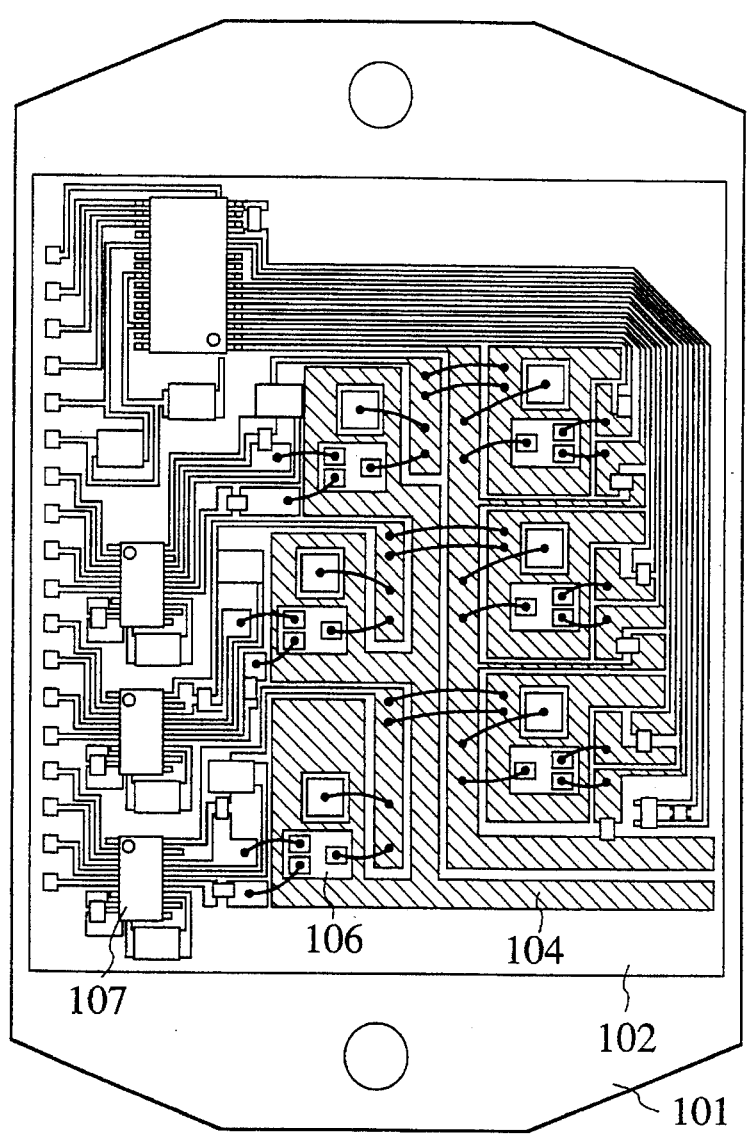
FIGS. 12A and 12B are plan and sectional views showing a semiconductor device according to a prior art.
Figure 12B:
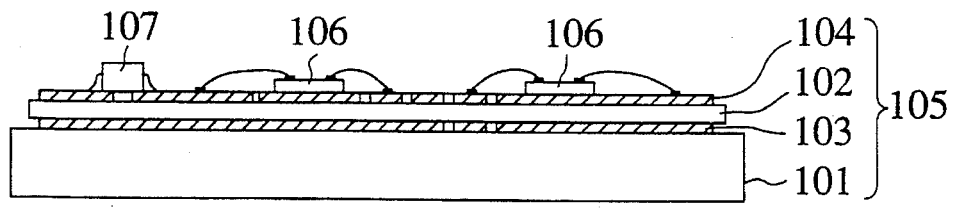

When the interconnect substrates 2 and 3 are attached to the metal base 1, the substrates 2 and 3 are electrically connected to each other through the extensions 13 that are part of the wiring pattern 10 and protrude from the interconnect substrate 3. This embodiment eliminates the jumper wire process of FIG. 10, thereby simplifying the assembling work of the substrates 2 and 3 and improving productivity.

The interconnect substrates 2 and 3 are each finished as an independent interconnect substrate completely with elements and wiring. Accordingly, the interconnect substrates 2 and 3 can be discretely tested to find defects before a final assembling work. This results in reducing parts losses and a ratio of final defects and improving productivity.

The power element interconnect substrate 3 has the thick wiring pattern 10 to reduce wiring resistance and heat generation. Accordingly, no heat produced by the power element will affect the control element interconnect substrate 2. This results in stabilizing the operation of the interconnect substrate 2 and effecting a positive feedback action to stabilize the operation of the power semiconductor elements.

Figure 4A:
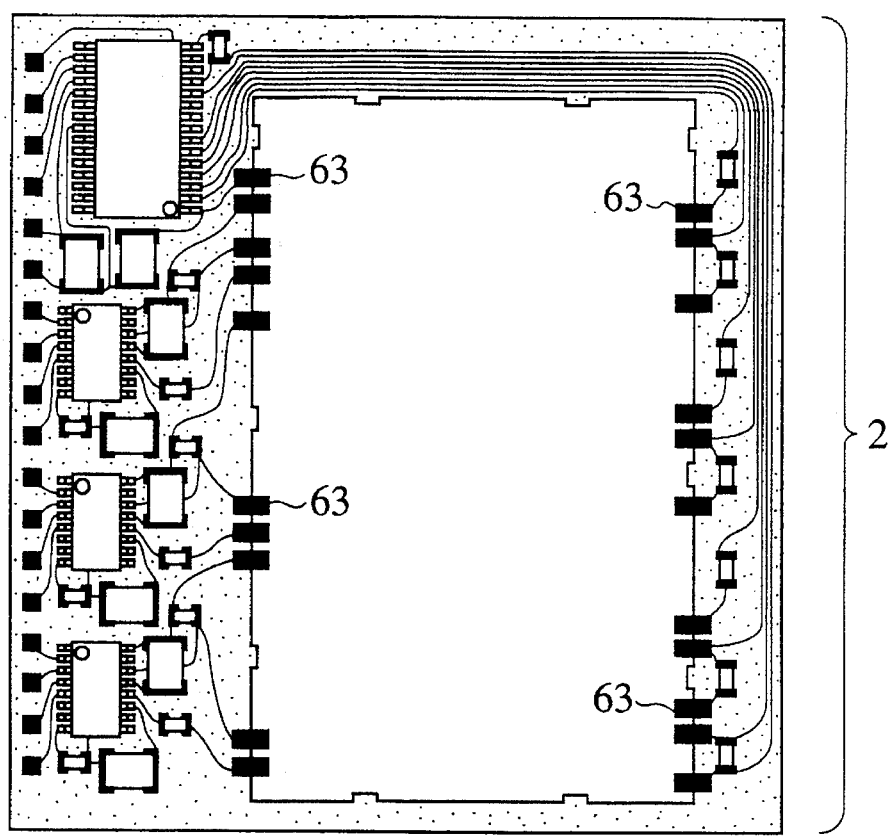
FIGS. 4A and 4B are exploded views showing a semiconductor device according to a second embodiment of the present invention.
Figure 4B:
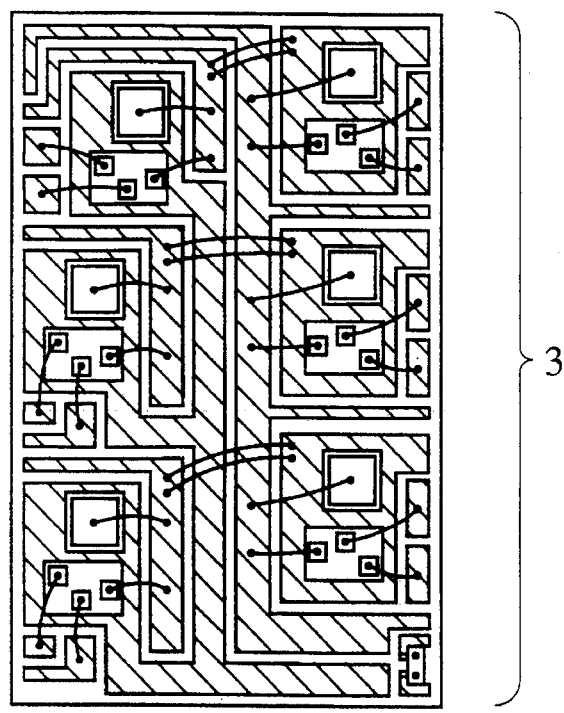

FIGS. 4A and 4B are plan views showing a semiconductor device according to the second embodiment of the present invention. Extensions 63 protrude from a control element interconnect substrate 2. A wiring pattern 6 on the interconnect substrate 2 is usually thin, e.g., 0.035 millimeters, so that only the extensions 63 must be thickened to about 0.3 millimeters to improve their mechanical strength. The first embodiment is appropriate when the total thickness of the metal layer 9 and ceramic substrate 8 on the power element interconnect substrate 3 is thicker than the total thickness of the wiring pattern 6, metal layer 5, and resin substrate 4 of the control element interconnect substrate 2. The second embodiment is appropriate when the total thickness of the wiring pattern 10, metal layer 9, and ceramic substrate 8 of the interconnect substrate 3 is thinner than the total thickness of the metal layer 5 and resin substrate 4 of the interconnect substrate 2. When the control element interconnect substrate 2 is thick due to multilayer wiring or an additional shield pattern, the second embodiment will be proper.

Figure 5:
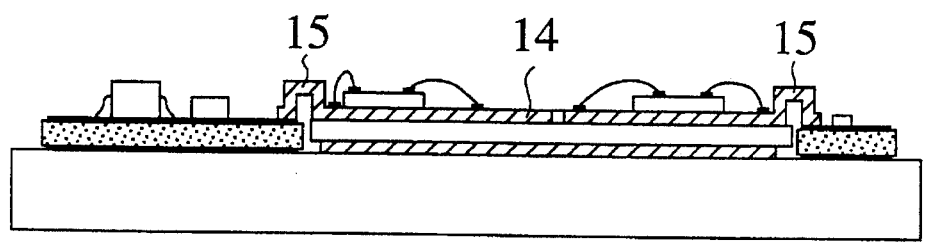

FIGS. 5 to 7 show a semiconductor device according to the third embodiment of the present invention. FIG. 5 is a sectional view of the device. A plan view of the device is the same as that of the first embodiment. According to the first embodiment of FIG. 1, the extensions 13 protrude from the wiring pattern 10 in parallel with the surface plane of interconnect substrate 3. On the other hand, extensions 15 of FIG. 5 protrude from a wiring pattern 14 into a C shape.

Figure 7B:
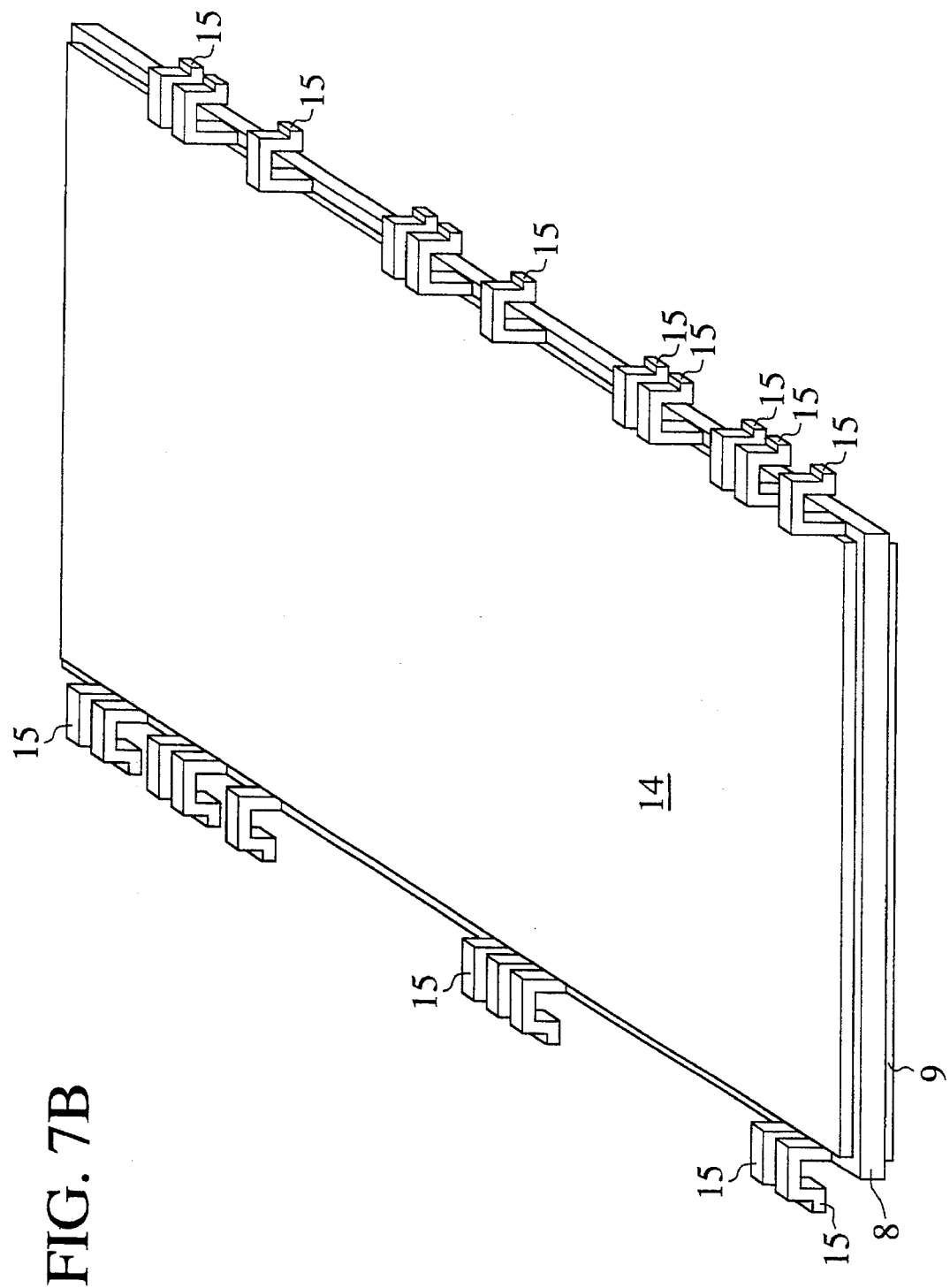

This shape absorbs stress caused by thermal expansion at connections between a power element interconnect substrate 3 and a control element interconnect substrate 2. The shape also absorbs a thickness difference between the substrates 3 and 2, to easily electrically connect the interconnect substrates 3 and 2 to each other. FIG. 6 is an enlarged view showing one of the extensions 15. The extension 15 involves four bent corners. One of the corners at the tip of the extension 15 may be omitted, to have three bent corners in total. The height h1 or h2 of a step formed at the corners may be one to two times, preferably, 1.5 times the thickness t of the wiring pattern 14. If there is substantially no thickness difference between the interconnect substrates 2 and 3, the height h1 may be greater than the height h2 by 0.03 to 0.1 millimeters. If the thickness difference between the interconnect substrates 2 and 3 is known in advance, the heights h1 and h2 are set to compensate the difference. In FIG. 6, d1 is approximately equal to t to 2t, and d2 is approximately equal to t. The extensions 15 are formed by stamping a mother plate made of Cu of 0.3 to 0.5 millimeters thick as shown in FIG. 7A, bonding the punched plate to a ceramic substrate 8 directly or through an Ni-plated layer, and bending the plate as shown in FIG. 7B. When the extensions 15 of FIG. 7A are short, they form the first embodiment of FIG. 1. In any case, the extensions 13 and 15 are merged with their respective mother plates made of Cu.

Figure 8:
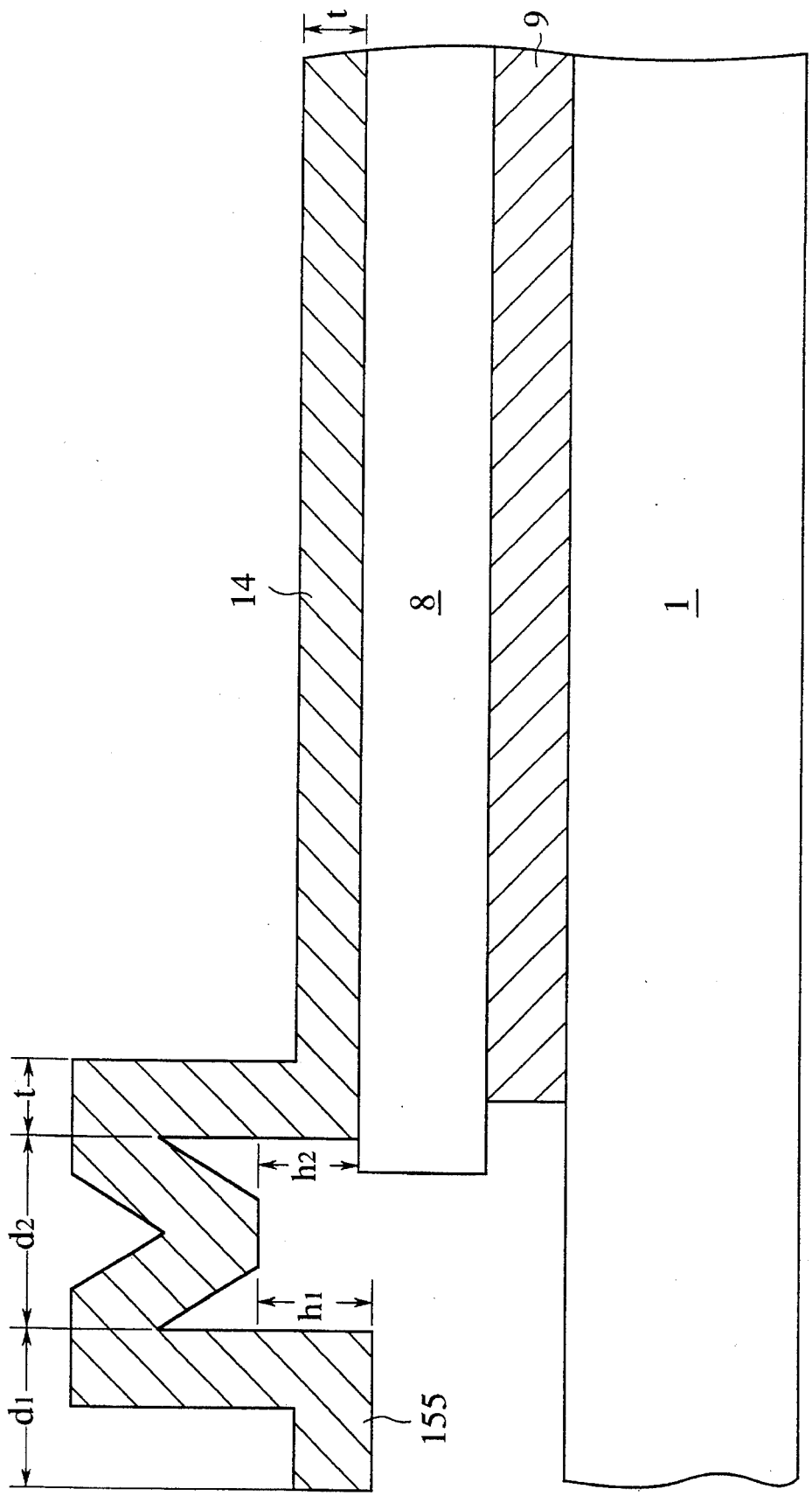
FIG. 8 is a sectional view showing a semiconductor device according to a fourth embodiment of the present invention.

The shapes of the extensions 13 and 15 are not limited to those of the first to third embodiments. FIG. 8 shows the fourth embodiment of the present invention. This embodiment employs M-shaped extensions 155 each having five bent corners. It is preferable that heights h1 and h2 are each approximately equal to t to 2t, d1 approximately equal to t to 2t, and d2 approximately equal to 2t to 3t. If there is a thickness difference between a control element interconnect substrate 2 and a power element interconnect substrate 3, a difference between the heights h1 and h2 is determined according to the thickness difference. The M-shaped extensions 155 absorb stress caused at connections between the interconnect substrates 2 and 3 due to thermal expansion differences. FIGS. 6 and 8 show only examples of the shapes of the extensions. The extensions may be formed into W, Σ, or any other shapes. Any shape is acceptable if it has bends to form a step having heights hi and h2 a difference between which is one to two times the thickness of a wiring pattern. Similar to the first embodiment, the second to fourth embodiments reduce the area of the control element interconnect substrate without deteriorating the characteristics of the power element interconnect substrate and are capable of independently testing and easily assembling both the interconnect substrates.

The first to fourth embodiments reduce the total area of a semiconductor device to about 87% of the prior art device, to realize compact and light electronic devices employing power semiconductor elements. The embodiments of the present invention form substantially no thickness level difference in conductors on the control element interconnect substrate, so that solder resist may be easily applied to the control element interconnect substrate and surface mounted parts may be easily fixed to the control element interconnect substrate. The control element interconnect substrate may have a very fine structure, to reduce parasitic impedance and realize high-frequency high-speed operation. The control element interconnect substrate and power element interconnect substrate are separately formed so that their characteristics can be separately tested. This results in reducing parts losses when defects are found.

Figure 9A:
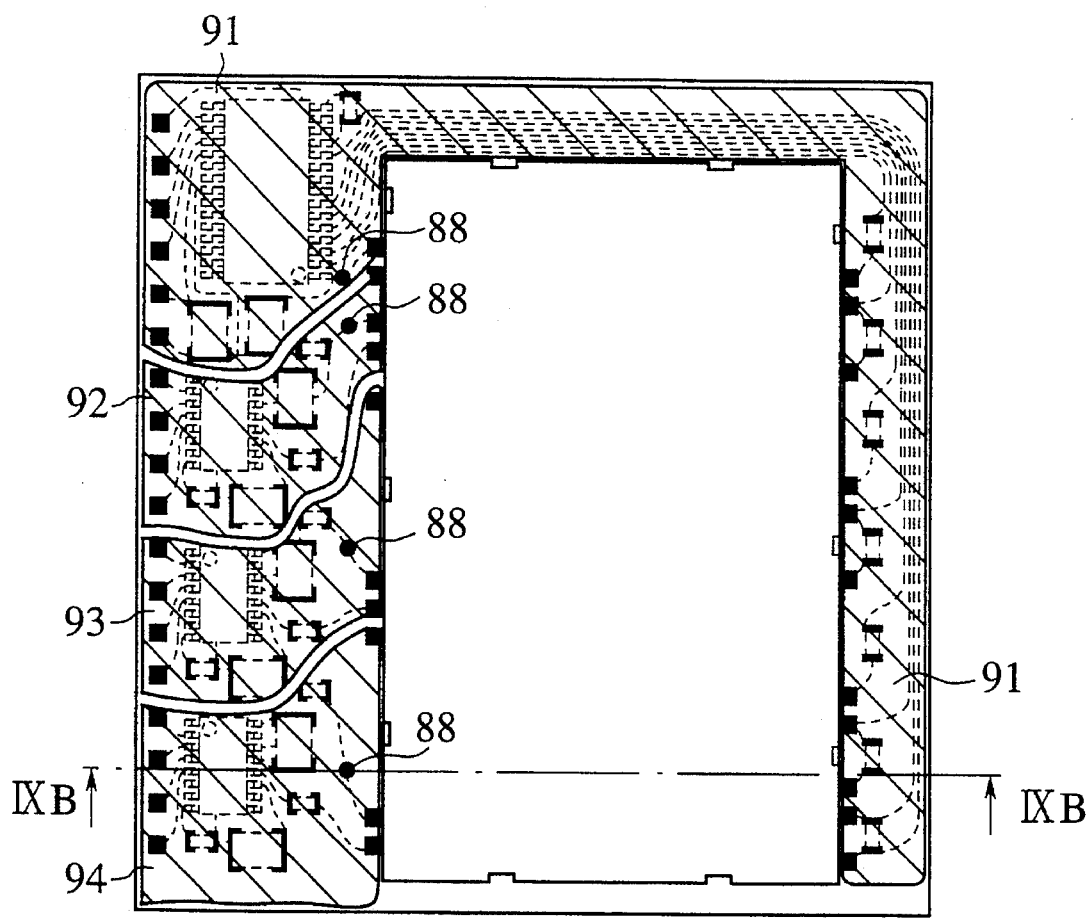
FIGS. 9A and 9B are plan and sectional views showing a semiconductor device according to a fifth embodiment of the present invention.
Figure 9B:
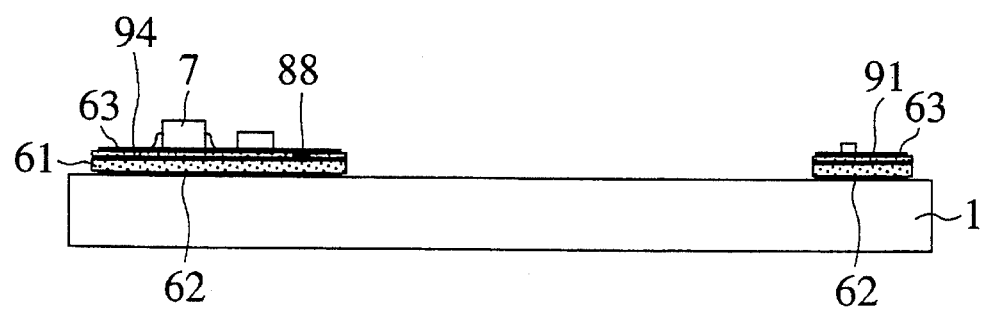

Although the first embodiment relates to the inverter circuit of FIG. 3, the present invention is applicable to electric circuits of all kinds. In the first to third embodiments, the control element interconnect substrate has a monolayer wiring structure. The present invention is applicable to a multilayer wiring structure by thinning the wiring pattern 6 of FIG. 1B. FIGS. 9A and 9B show the fifth embodiment of the present invention. This embodiment arranges a shield pattern under a wiring pattern in a control element interconnect substrate. The shield pattern prevents malfunctions of control elements mounted on the wiring pattern. The shield pattern includes a low-voltage shield plate 91 and three high-voltage shield plates 92, 93, and 94. FIG. 9B is a sectional view taken along a line I–I' of FIG. 9A. A power element interconnect substrate is not shown. A resin substrate 61 is divided into two layers as shown in FIG. 9B, and the shield plates 91 to 94 are interposed between the two layers. On the resin substrate 61, the wiring pattern 63 made of, for example, Cu of about 0.035 millimeters thick is formed. A metal layer 62 is formed on the bottom surface of the resin substrate 61. The metal layer 62 is soldered onto a metal base 1. The shield plates 91 to 94 are electrically connected to a ground of the control element interconnect substrate through via holes 88. The shapes of the shield plates are not limited to those of FIGS. 9A and 9B. The shapes may be optionally determined according to control circuits. The wiring pattern 63 can be thinned because the control element interconnect substrate is independent of the power element interconnect substrate. Accordingly, the shield plates can be freely arranged.

The embodiment of FIG. 3 employs the IGBTs as power semiconductor elements. According to the present invention, the power semiconductor elements may be not only the IGBTs but also power MOSFETs, GT0 thyristors, and SI thyristors. Power modules and power ICs may be mounted on the power element interconnect substrate. The control element interconnect substrate may include not only the control circuits mentioned in connection with the first embodiment but also various kinds of protective circuits such as overcurrent protective circuits and overheat protective circuits.

The power semiconductor elements and control ICs employed by the present invention may be made from any kind of semiconductor materials such as Si, Ge, GaAs, and SiC. The metal base may be made from not only Cu but also Al, Fe, and other metals. The insulation substrate of the power element interconnect substrate may be made from thermal conductive materials such as alumina, AlN, beryllia, and Insulated Metal Substrate. The insulation substrate of the control element interconnect substrate may be made from not only glass epoxy resin but also phenol resin, or any other resin. The control element interconnect substrate may be composed of a ceramic substrate such as an alumina substrate coated with a metal conductor layer, if the metal conductor layer is thin. The semiconductor devices according to the present invention are applicable to inverter air conditioners, general-purpose inverters, AC servo devices, uninterruptible power sources, audio amplifiers, automobile electronic controllers, etc.

Various modifications will become possible for those skilled in the art after receiving the teachings of the present disclosure without departing from the scope thereof.

What is claimed is:

1. A semiconductor device comprising:
   (a) a first insulating interconnect substrate for packaging power semiconductor elements;
   (b) a second insulating interconnect substrate for packaging control elements for controlling the power semiconductor elements; and
   (c) a metal base for supporting said first and second insulating interconnect substrates, wherein:
   the top surfaces of said first and second insulating interconnect substrate are provided each with a conductive wiring pattern, the conductive wiring patterns on said first and second interconnect substrates are electrically connected to each other through extensions protruding from the wiring pattern of one of said first and second interconnect substrates and said extensions are part of the wiring pattern and formed as one body.

2. The semiconductor device according to claim 1, wherein said first insulating interconnect substrate includes a ceramic substrate.

3. The semiconductor device according to claim 1, wherein said second insulating interconnect substrate includes a resin substrate.

4. The semiconductor device according to claim 1, wherein the wiring pattern on said first insulating interconnect substrate has a part whose thickness is 0.1 millimeters or thicker, and the wiring pattern on said second insulating interconnect substrate has a part whose thickness is 0.1 millimeters or thinner.

5. The semiconductor device according to claim 1, wherein each of said extensions has at least three bends to form a level difference equal to one to two times the thickness of the wiring pattern on said first insulating interconnect substrate.

* * * * *